United States Patent
Dong (10) Patent No.: US 12,316,351 B2
(45) Date of Patent: May 27, 2025

(54) SELF-ORGANIZED ENCODER ARCHITECTURES INCLUDING BLIND INPUT SWAPPING SUPPORT

(71) Applicant: Intel Corporation, Santa Clara, CA (US)

(72) Inventor: Yikui Dong, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 17/556,742

(22) Filed: Dec. 20, 2021

(65) Prior Publication Data

US 2023/0198546 A1 Jun. 22, 2023

(51) Int. Cl.
*H03M 7/16* (2006.01)
*H03K 19/20* (2006.01)

(52) U.S. Cl.
CPC ............ *H03M 7/165* (2013.01); *H03K 19/20* (2013.01)

(58) Field of Classification Search
CPC ................................ H03M 7/165; H03K 19/20
See application file for complete search history.

(56) References Cited

U.S. PATENT DOCUMENTS

| | | | | |
|---|---|---|---|---|
| 4,243,976 A | * | 1/1981 | Warner | H04L 25/22 341/57 |
| 4,346,367 A | * | 8/1982 | Leinweber | H04L 25/22 341/57 |
| 4,426,699 A | * | 1/1984 | Tanaka | H03K 19/21 340/146.2 |
| 4,586,025 A | * | 4/1986 | Knierim | H03M 7/165 341/97 |
| 4,661,801 A | * | 4/1987 | Chen | H03K 5/1536 714/810 |
| 4,733,220 A | * | 3/1988 | Knierim | H03M 1/36 341/64 |
| 4,897,657 A | * | 1/1990 | Brubaker | H03M 7/165 341/96 |
| 4,958,157 A | * | 9/1990 | Miki | H03M 7/20 341/50 |
| 4,963,874 A | * | 10/1990 | Matsuzawa | H03M 1/0809 341/155 |
| 5,012,246 A | * | 4/1991 | Chung | H03M 1/0872 341/94 |

(Continued)

OTHER PUBLICATIONS

Chen, Kuan-Chang, "A 60-Gb s PAM4 Wireline Receiver With 2-Tap Direct Decision Feedback Equalization Employing Track-and-Regenerate Slicers in 28-nm CMOS", IEEE Journal of Solid-State Circuits, (Mar. 2020), 13 pgs.

(Continued)

*Primary Examiner* — Lam T Mai
(74) *Attorney, Agent, or Firm* — NICHOLSON DE VOS WEBSTER & ELLIOTT LLP (57) ABSTRACT

Some embodiments include an encoder to convert a thermometer code into a binary code output information or a Gray code output information. The encoder supports blind input swapping, such that it provides correct output information without prior knowledge of the input swapping. Some embodiments also include a truth table that has additional rows to describe output information when input information at inputs of the encoder is swapped. The encoder includes symmetrical logic functions with respect to information at its inputs as building blocks.

25 Claims, 7 Drawing Sheets

(56) References Cited

U.S. PATENT DOCUMENTS

| | | | | |
|---|---|---|---|---|
| 5,113,187 | A * | 5/1992 | Gorshe | H03M 5/12 341/94 |
| 5,243,348 | A * | 9/1993 | Jackson | H03M 7/165 341/64 |
| 5,382,955 | A * | 1/1995 | Knierim | H03M 1/36 714/E11.007 |
| 5,459,466 | A * | 10/1995 | Knierim | H03M 7/165 341/97 |
| 5,625,830 | A * | 4/1997 | Gray | H03M 7/005 341/52 |
| 5,657,018 | A * | 8/1997 | Kohno | H03M 7/165 341/96 |
| 6,388,602 | B1 * | 5/2002 | Yang | H03M 1/0687 341/97 |
| 6,433,725 | B1 * | 8/2002 | Chen | H03M 7/165 341/160 |
| 6,542,104 | B1 * | 4/2003 | Capofreddi | H03M 7/165 341/103 |
| 7,002,503 | B2 * | 2/2006 | Lee | H03M 7/22 341/160 |
| 7,352,297 | B1 * | 4/2008 | Rylyakov | H03M 7/165 331/25 |
| 7,667,633 | B2 * | 2/2010 | Choi | G04F 10/005 341/157 |
| 7,675,440 | B1 * | 3/2010 | Xiao | H03M 7/165 341/161 |
| 8,878,713 | B1 * | 11/2014 | Thachile | H03M 1/1033 341/158 |
| 10,581,448 | B1 * | 3/2020 | Far | H03M 7/16 |
| 2003/0067338 | A1 * | 4/2003 | Kim | G11C 7/22 327/291 |
| 2004/0027266 | A1 * | 2/2004 | Lee | H03M 7/165 341/160 |
| 2005/0062634 | A1 * | 3/2005 | Lee | H03M 7/22 341/144 |
| 2007/0262887 | A1 * | 11/2007 | Matsuura | H03M 7/165 341/50 |
| 2011/0037632 | A1 * | 2/2011 | Lai | H03M 1/1009 341/120 |
| 2019/0165820 | A1 * | 5/2019 | Xu | H03M 3/502 |

OTHER PUBLICATIONS

Im, Jay, "A 40-to-56 Gb s PAM-4 Receiver With Ten-Tap Direct Decision-Feedback Equalization in 16-nm FinFET", IEEE Journal of Solid-State Circuits, vol. 52, No. 12, (Dec. 2017), 17 pgs.

Roshan-Zamir, Ashkan, "A 56 Gb s PAM4 Receiver with Low-Overhead Threshold and Edge-Based DFE FIR and IIR-Tap Adaptation in 65nm CMOS", 2018 IEEE Custom Integrated Circuits Conference (CICC), (May 10, 2018), 4 pgs.

* cited by examiner

| PAM LEVEL | THERMOMETER CODED SAMPLER OUTPUTS | | | BINARY CODED ENCODER OUTPUTS | |
| --- | --- | --- | --- | --- | --- |
| | 113D | 112D | 111D | MSB_BINARY | LSB_BINARY |
| L4 | 1 | 1 | 1 | 1 | 1 |
|  | 1 | 1 | 0 | 1 | 0 |
|  | 1 | 0 | 0 | 0 | 1 |
| L3 | 0 | 1 | 1 | 1 | 0 |
| L2 | 0 | 0 | 1 | 0 | 1 |
| L1 | 0 | 0 | 0 | 0 | 0 |

SELF-ORGANIZED ENCODER ARCHITECTURES INCLUDING BLIND INPUT SWAPPING SUPPORT

TECHNICAL FIELD

Embodiments described herein pertain to receivers in integrated circuits. Some embodiments relate to encoders that convert a thermometer code into a binary code or a Gray code.

BACKGROUND

Many electrical devices communicate with each other in the form of electrical signals. Pulse Amplitude Modulation (PAM) signaling is widely used in high-speed (e.g., gigabit per second (Gbps) range) in wireline communication protocols. In PAM signaling, the amplitude (e.g., voltage level) of the signal during a unit interval (UI), which is a fixed time interval (e.g., a clock period), represents the value of a bit (or multiple bits) transmitted during that UI. For PAM4 signaling (4-level PAM), two bits of information can be transmitted in a UI. The value of the two bits in PAM4 in a particular UI can be represented by one of four possible levels (symbols) transmitted during that particular UI. A receiver in a device that communicates using PAM4 signaling has three samplers (also called slicers or comparators) to receive incoming PAM4 signals. The three samplers produce a 3-bit thermometer code corresponding to one of four PAM4 levels (symbols) for every sampling UI. Thermometer-to-binary circuitry of the receiver translates the 3-bit thermometer code into a binary code (e.g., two binary bits). The two binary bits (e.g., binary code) are subsequently provided to additional circuitry of the receiver for downstream signal processing. Some receivers may have thermometer-to-gray circuitry (instead of thermometer-to-binary circuitry) to translate the 3-bit thermometer code into a Gray code (e.g., two Gray-coded bits) for downstream signal processing. As described in more detail below, conventional circuitries for conversion of a thermometer code into a binary code or a Gray code may be unsuitable for techniques described herein.

DETAILED DESCRIPTION

The techniques described herein relate to an encoder architecture including an encoder that can operate to convert a thermometer code into a binary code or a Gray code. The described encoder can operate to provide correct (e.g., valid) output information even when information at its inputs are swapped. The support of ad hoc input swapping described herein may be unsuitable for conventional thermometer-to-binary or thermometer-to-gray encoders because such conventional encoders often lack structures to operate correctly with input swapping described herein. In an example, the techniques described herein include receiving circuitry that includes a sampling circuit to sample an input signal and provide thermometer-coded information based on the sampling. The receiving circuitry can include an encoder (thermometer-to-binary encoder or the thermometer-to-binary encoder) that is self-organized such that the encoder can provide correct output information even if information at inputs of the encoder are swapped. Further, the described encoder can support blind input swapping, such that it can provide correct output information without prior knowledge of the input swapping. An example circuit implementation described herein includes symmetrical logic circuits (e.g., "AND", "OR", and "XOR" and their inversions) with respect to thermometer-coded information from the sampling circuit as building blocks. The example circuit implementation is based on a truth table that is unlike a traditional truth table. The truth table described herein has additional rows that describe correct output information in spite of input swapping at inputs of the encoder. The techniques described herein can be included in devices or systems where input swapping is useful. Other improvements and benefits of the described techniques are discussed below. The techniques described herein use PAM4 signals as an example. However, one skilled in the art will readily recognize that the techniques described herein are applicable to 8-level PAM (PAM8), 16-level PAM (PAM16), or other multiple levels PAM signaling.

Figure 1A:
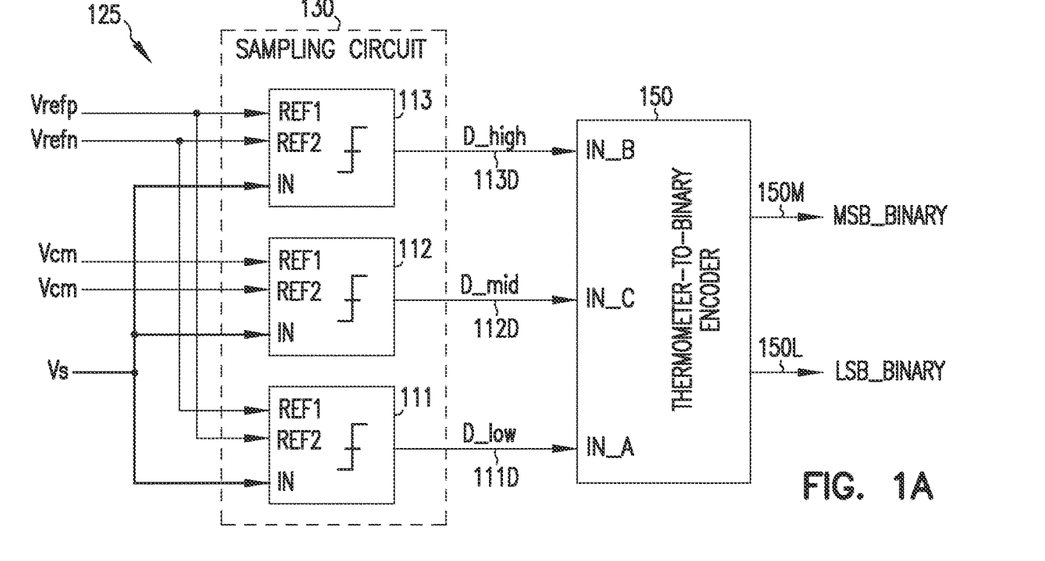
FIG. 1A shows a block diagram of an apparatus in the form of receiving circuitry including a sampling circuit and a thermometer-to-binary encoder, according to some embodiments described herein.

FIG. 1A shows a block diagram of receiving circuitry 125 including a sampling circuit 130 and a thermometer-to-binary encoder 150, according to some embodiments described herein. Receiving circuitry 125 can be included in a receiver of an integrated circuit (IC) device or system. As shown in FIG. 1A, receiving circuitry 125 can receive a signal Vs, which is an input signal. Signal Vs can include PAM4 signals. Receiving circuitry 125 can operate to sample information (e.g., symbols) included in signal Vs during a UI (e.g., a period) of clock signal (not shown) provided to sampling circuit 130.

Figure 1B:
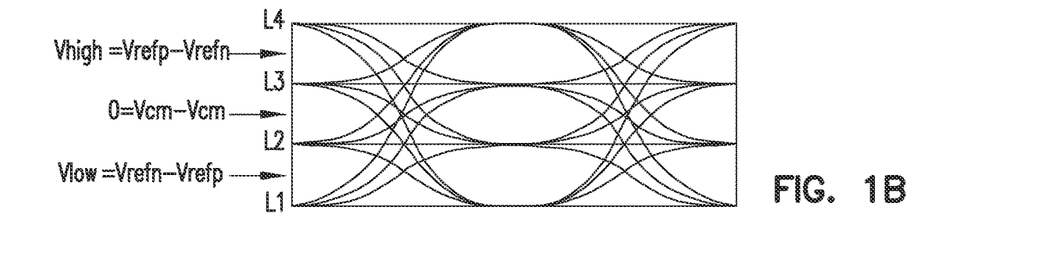
FIG. 1B shows an eye diagram of an input signal at an input of the sampler circuit of FIG. 1A and the relationships among levels of a PAM4 signaling of the input signal and different reference thresholds, according to some embodiments described herein.

FIG. 1B shows an eye diagram of signal Vs and the relationships among levels L1, L2, L3, and L4 of signal Vs of FIG. 1A and reference thresholds Vhigh, 0, and Vlow. Levels L1, L2, L3, and L4 in FIG. 1B can correspond to symbols $-3$, $-1$, $+1$, and $+3$, respectively, in a UI of a PAM4 signal. In FIG. 1B, Vrefp, Vrefn, and Vcm are different reference information (e.g., reference voltages) where Vrefn<Vcm<Vrefp. Reference information Vrefp and Vrefn can be part of a differential pair signal. In FIG. 1B, Vhigh, 0, and Vlow are different reference thresholds (e.g., voltage levels) that can be used as reference points to sample the levels of signal Vs. As shown in FIG. 1B, reference threshold Vhigh=Vrefp−Vrefn, reference threshold 0=Vcm−Vcm, and reference threshold Vlow=Vrefn−Vrefp.

As shown in FIG. 1B, signal Vs can include PAM4 signals where levels L1, L2, L3, and L4 can correspond to the different amplitudes (e.g., different voltage levels in volt unit) of signal Vs (FIG. 1A). The value (e.g., voltage values) of each of reference thresholds Vhigh, 0, and Vlow can be between (e.g., at a midpoint of) respective two adjacent levels of signal Vs. For example, as shown in FIG. 1B, reference threshold Vlow can be between levels L1 and L2. Reference threshold 0 can be between levels L2 and L3. Reference threshold Vhigh can be between levels L3 and L4.

FIG. 1B also shows one UI of signal Vs. The UI is measured in time unit (horizontal axis). Within one UI, signal Vs can have any of levels L1, L2, L3, and L4. Each of levels L1, L2, L3, and L4 can be used to represent a different value of a combination of two bits of information (e.g., "00", "01", "10", or "11") carried by signal Vs in one UI. Thus, within one UI, signal Vs can be used to carry two bits of information having one of four possible combinations of two bits (e.g., "00", "01", "10", or "1").

As shown in FIG. 1A, sampling circuit 130 can include samplers (e.g., slicers or comparators) 111, 112, and 113. Each of samplers 111, 112, and 113 can include inputs (e.g., input nodes) IN, REF1, and REF2. Samplers 111, 112, and 113 can include respective output (e.g., output nodes) 111D, 112D, and 113D.

Inputs IN of samplers 111, 112, and 113 can receive the same signal Vs. Inputs REF1 and REF2 of sampler 112 can receive the same reference information Vcm. Inputs REF1 and REF2 of sampler 111 can receive reference information that is opposite from inputs REF1 and REF2 of sampler 113. For example, as shown in FIG. 1A, inputs REF1 and REF2 of sampler 111 can receive reference information Vrefn and Vrefp, respectively, whereas inputs REF1 and REF2 of sampler 113 can receive reference information Vrefp and Vrefn, respectively.

Samplers 111, 112, and 113 can operate to sample the same signal Vs (e.g., a PAM4 signal) based on reference thresholds Vlow, 0, and Vhigh, respectively. For example, samplers 111, 112, and 113 can operate to compare signal Vs with reference thresholds Vlow, 0, and Vhigh, respectively, and provide information D_low, D_mid, and D_high, respectively, at respective outputs 111D, 112D, and 113D of samplers 111, 112, and 113 based on the comparisons. Information D_low, D_mid, and D_high are output information (e.g., digital output information) from sampling circuit 130 that can be represented by signals on the outputs 111D, 112D, and 113D, respectively.

Information D_low, D_mid, and D_high can include three bits at respective outputs 111D, 112D, and 113D, respectively, in a UI of signal Vs. The three bits (represented by respective information D_low, D_mid, and D_high) can form thermometer-coded information (e.g., a 3-bit thermometer code). Thermometer-to-binary encoder 150 can operate to determine the value (a binary value of two bits) of information represented by signal Vs in a UI (e.g., represented by one symbol of signal Vs in a UI) based on the thermometer-coded information.

As shown in FIG. 1A, thermometer-to-binary encoder 150 can include inputs (e.g., input nodes) IN_A, IN_B and IN_C coupled to outputs (e.g., output nodes) 111D, 113D, and 112D, respectively, of samplers 111, 113, and 112, respectively. Information D_low, D_high, and D_mid from samplers 111, 113, and 112, respectively, can be provided as input information to inputs IN_A, IN_B and IN_C of thermometer-to-binary encoder 150. As shown in FIG. 1A, thermometer-to-binary encoder 150 can include outputs (e.g., output nodes) 150L and 150M to provide output information (e.g., binary-coded information) LSB_BINARY and MSB_BINARY, respectively.

Thermometer-to-binary encoder 150 can operate to convert information D_low, D_mid, and D_high (thermometer-coded information) from outputs 111D, 112D, and 113D of samplers 111, 112, and 113, respectively, into binary-coded information. For example, thermometer-to-binary encoder 150 can generate information (e.g., encoder output information) LSB_BINARY and MSB_BINARY based on information D_low, D_mid, and D_high. Information LSB_BINARY and MSB_BINARY form binary-coded information (e.g., a 2-bit binary code). Information LSB_BINARY and MSB_BINARY represent the least-significant-bit (MSB) and the most-significant-bit (MSB), respectively, of the binary-coded information. As described above, receiving circuitry 125 can be included in a receiver. Information LSB BINARY and MSB BINARY can be provided to additional circuitry (e.g., a deserializer, not shown) of the receiver for further processing.

Figure 1C:
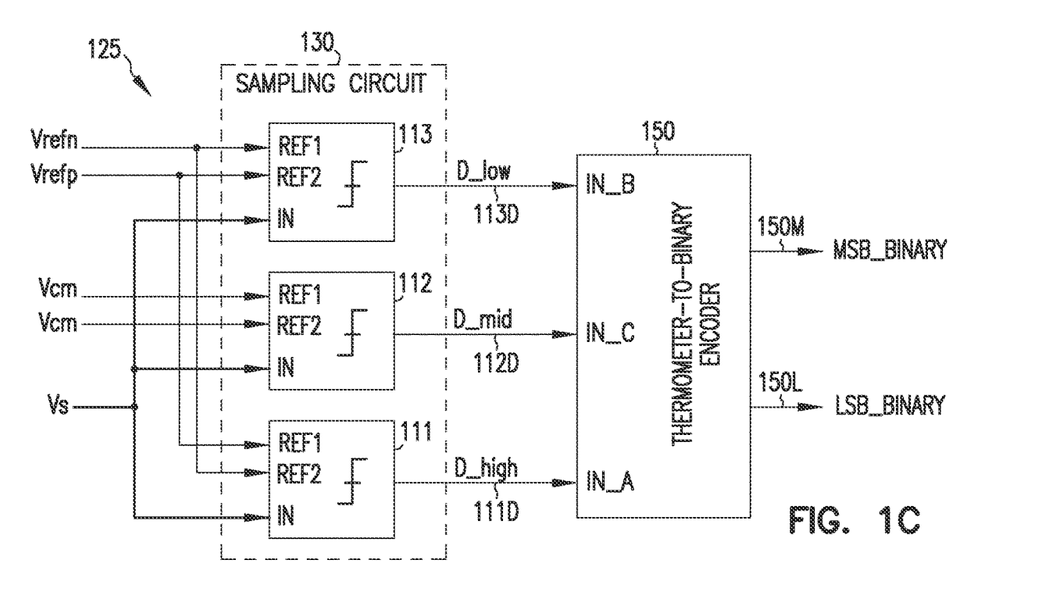
FIG. 1C shows the receiving circuitry of FIG. 1A including input swapping at inputs of the thermometer-to-binary encoder of FIG. 1A, according to some embodiments described herein.

FIG. 1C shows receiving circuitry 125 including input swapping at inputs of thermometer-to-binary encoder 150, according to some embodiments described herein. As shown in FIG. 1C, the information (input information) at inputs IN_A and IN_B of thermometer-to-binary encoder 150 are D_high and D_low, respectively. Thus, in comparison with information D_low and D_high at inputs IN_A and IN_B, respectively, of thermometer-to-binary encoder 150 in FIG. 1A, information at inputs IN_A and IN_B in FIG. 1C are swapped.

In FIG. 1C, the functions of samplers 111 and 113 are swapped, such that samplers 111 and 113 operate at different reference thresholds in comparison with reference thresholds of samplers 111 and 113 in FIG. 1A. As shown in FIG. 1C, unlike FIG. 1A, samplers 111 and 113 can provide information D_high and D_low, respectively. The function of sampler 112 in FIG. 1C can remain the same, such that it can operate to provide information V_mid based on the same reference threshold (e.g., Vcm−Vcm=0) like the reference threshold of samplers 112 FIG. 1A.

As shown in FIG. 1C, sampler 111 can receive reference information Vrefp and Vrefn at its inputs REF1 and REF2, respectively. Thus, in comparison with sampler 111 in FIG. 1A, reference information Vrefp and Vrefn at inputs REF1 and REF2, respectively, of sampler 111 in FIG. 1C are switched. Sampler 111 in FIG. 1C can operate to sample signal Vs based on reference threshold Vhigh (e.g., Vhigh=Vrefp−Vrefn) to provide information D_high (instead of information D_low) to input IN_A of thermometer-to-binary encoder 150.

As shown in FIG. 1A and FIG. 1C, input REF1 of sampler 111 can be coupled to different nodes (e.g., reference nodes) that provide respective reference information Vrefp and Vrefn at different times. Similarly, input REF2 of sampler 111 can be coupled to different nodes (e.g., reference nodes) that provide respective reference information Vrefp and Vrefn at different times. For example, in FIG. 1A, input REF1 of sampler 111 can be coupled to the node that provides reference information Vrefn. In FIG. 1C, input REF1 of sampler 111 can be coupled to the node that provides reference information Vrefp. In another example, in FIG. 1A, input REF2 of sampler 111 can be coupled to the node that provides reference information Vrefp. In FIG. 1C, input REF2 of sampler 111 can be coupled to the node that provides reference information Vrefn.

In FIG. 1C, sampler 113 can receive reference information Vrefp and Vrefn at its inputs REF2 and REF1, respectively. Thus, in comparison with sampler 113 in FIG. 1A, reference information Vrefp and Vrefn at inputs REF2 and REF1, respectively, of sampler 113 in FIG. 1C are switched. Sampler 113 in FIG. 1C can operate to sample signal Vs based on reference threshold Vlow (e.g., Vlow=Vrefn−Vrefp) to provide information D_low (instead of information D_high) to input IN_B of thermometer-to-binary encoder 150.

As shown in FIG. 1A and FIG. 1C, input REF1 of sampler 113 can be coupled to different nodes (e.g., reference nodes) that provide respective reference information Vrefp and Vrefn at different times. Similarly, input REF2 of sampler 113 can be coupled to different nodes (e.g., reference nodes) that provide respective reference information Vrefp and Vrefn at different times. For example, in FIG. 1A, input REF1 of sampler 113 can be coupled to the node that provides reference information Vrefp. In FIG. 1C, input REF1 of sampler 113 can be coupled to the node that provides reference information Vrefn. In another example, in FIG. 1A, input REF2 of sampler 113 can be coupled to the node that provides reference information Vrefn. In FIG. 1C, input REF2 of sampler 113 can be coupled to the node that provides reference information Vrefp.

Although information (e.g., input information D_low and D_high) at inputs IN_A and IN_B of thermometer-to-binary encoder 150 are swapped between FIG. 1A and FIG. 1C, thermometer-to-binary encoder 150 can be self-organized to provide output information (e.g., binary-coded information) at outputs 150L and 150M that correctly reflex the value of signal Vs sampled by sampling circuit 130. Further, thermometer-to-binary encoder 150 can operate to support blind input swapping (e.g., swapping between information D_low and D_high) in that it can provide correct output information without prior knowledge of input swapping of information at inputs IN_A and IN_B.

Thus, as described above with reference to FIG. 1A and FIG. 1C, samplers 111 and 113 can be configured to swap functions at different times to provide swapped input information to thermometer-to-binary encoder 150. For example, at one time (or time interval), samplers 111 and 113 (FIG. 1A) operate to sample signal Vs based on the reference thresholds Vlow and Vhigh, respectively, and provide information D_low and D_high, respectively, to thermometer-to-binary encoder 150, as shown in FIG. 1A. In another example, at another time (e.g., or time interval) samplers 111 and 113 (FIG. 1C) operate to sample signal Vs based on the reference thresholds Vhigh and Vlow, respectively, and provide information D_high and D_low, respectively, to thermometer-to-binary encoder 150, as shown in FIG. 1C.

The self-organized and blind input swapping support allows thermometer-to-binary encoder 150 to be included in devices or systems where functions of some components (e.g., samplers like samplers 111 and 113) are swapped. In some devices or systems that include samplers (e.g., PAM4 samplers) like samplers 111, 112, and 113, swapping functions of the samplers from time to time may alleviate asymmetrical aging from the imbalance in sampler operations (e.g., imbalance of "0" and "1" logic detection).

Figure 1D:
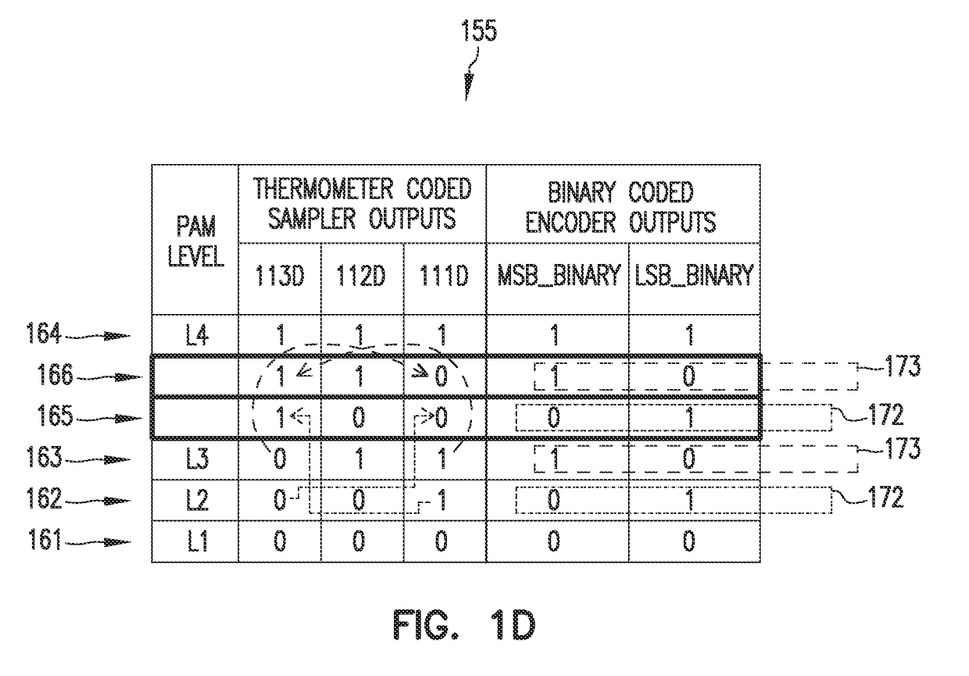
FIG. 1D is a table (logic table) showing relationships among the levels of the input signal of FIG. 1A, thermometer-coded information at outputs of the sampling circuit of FIG. 1A and FIG. 1C, and binary-coded information at outputs of the thermometer-to-binary encoder of FIG. 1A and FIG. 1C, according to some embodiments described herein.

FIG. 1D is a table (logic table) 155 showing relationships among levels L1, L2, L3, and L4 of signal Vs (FIG. 1A and FIG. 1C), and values (represented by information D_low, D_mid, and D_high in FIG. 1A and FIG. 1C) at respective outputs 111D, 112D, and 113D of samplers 111, 112, and 113 (FIG. 1A and FIG. 1C), and values of information LSB_BINARY and MSB_BINARY at respective outputs of thermometer-to-binary encoder 150 (FIG. 1A and FIG. 1C), according to some embodiments described herein. Circuit implementation of thermometer-to-binary encoder 150 can be based on table 155, as described below with reference to FIG. 2.

As shown in FIG. 1D, levels L1, L2, L3, and L4 (e.g., corresponding to symbols −3, −1, +1, and +3, respectively) in rows 161, 162, 163, and 164, respectively, can be associated with respective 3-bit thermometer-coded at sampler outputs 111D, 112D, and 113D (FIG. 1A) that are represented by information D_low, D_mid, and D_high, respectively, in FIG. 1A. Levels L1, L2, L3, and L4 can also be associated with respective 2-bit binary coded encoder outputs (output information) represented by information MSB_BINARY and LSB_BINARY (e.g., "00", "01", "10" and "11").

As shown in FIG. 1D, table 155 also includes rows 165 and 166 (in addition to rows 161, 162, 163, and 164) to represent input swapping operations (e.g., swapping of D_low and D_high) described above with reference to FIG. 1A and FIG. 1C. For example, as shown in FIG. 1D, outputs 111D and 113D have values "1" and "0", respectively, in row 162, and values "0" and "1", respectively, in row 165. This indicates that the information of outputs 111D and 113D (in rows 162 and 165) are swapped. However, binary coded encoder outputs in rows 162 and 165 have the same value 172 (e.g., "01"). Thus, even if the values of information at outputs 111D and 113D (in rows 162 and 165) are swapped, binary coded encoder outputs (in rows 162 and 165) provided by thermometer-to-binary encoder 150 can remain at the same value (value 172). In another example, information of outputs 111D and 113D (in row 166) have values "0" and "1", respectively, which have information swapped with respect to that ("1" and "0") of row 163. However, binary coded encoder outputs in rows 163 and 166 have the same value 173 (e.g., "10"). Thus, even if the values of information at outputs 111D and 113D (in rows 163 and 166) are swapped, binary coded encoder outputs (in rows 163 and 166) provided by thermometer-to-binary encoder 150 can remain at the same value (value 173). Based on table 155, information LSB_BINARY can be implemented as a combination of logic "AND", logic "OR", and logic "XOR" (and their inversion). Information MSB_BINARY can be implemented as buffered version of information D_mid.

Figure 2:
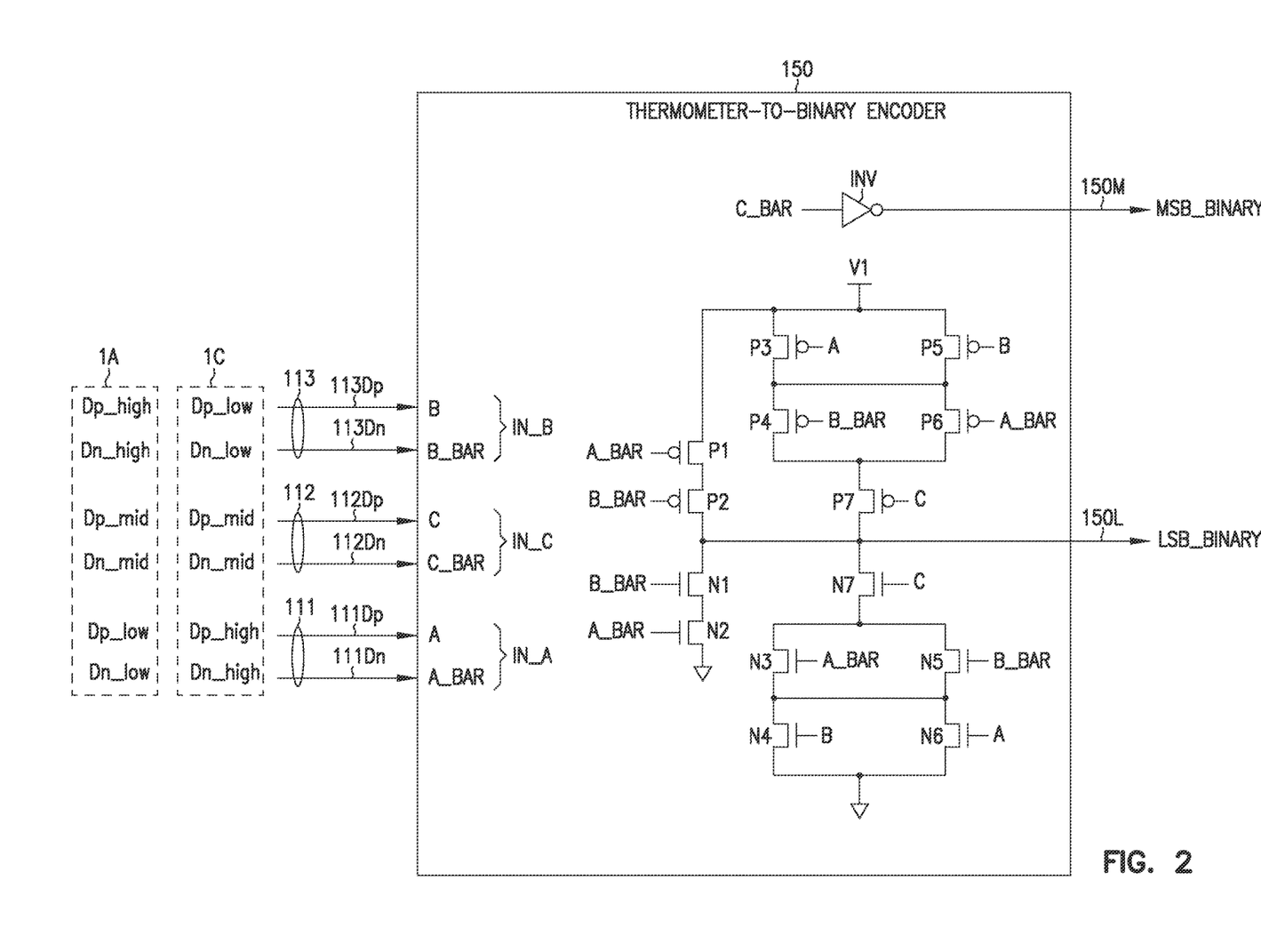
FIG. 2 shows an example circuit implementation of the thermometer-to-binary encoder of FIG. 1A and FIG. 1C based on the table of FIG. 1D, according to some embodiments described herein.

FIG. 2 shows circuit implementation of thermometer-to-binary encoder 150 (FIG. 1A and FIG. 1C) based on table 155 of FIG. 1D, according to some embodiments described herein. As shown in FIG. 2, thermometer-to-binary encoder 150 can include transistors P1 through P7 and N1 through N7, and an inverter INV. Transistors P1 through P7 can include field effect transistors (FETs), for example, p-channel metal-oxide semiconductor (PMOS) transistors. Transistors N1 through N7 can include FETs, for example, n-channel metal-oxide semiconductor (NMOS) transistors. Voltage V1 in FIG. 2 can include a supply voltage (e.g., Vcc) for thermometer-to-binary encoder 150. FIG. 2 shows differential forms of information D_low, D_mid, and D_high of FIG. 1A, FIG. 1C, and FIG. 1D.

In FIG. 2, outputs (e.g., output nodes) 111Dn and 111Dp are collectively shown in FIG. 1A and FIG. 1C as output 111D of sampler 111. In FIG. 2, outputs (e.g., output nodes) 112Dn and 112Dp are collectively shown in FIG. 1A and FIG. 1C as output 112D of sampler 112. In FIG. 2, outputs (e.g., output nodes) 113Dn and 113Dp are collectively shown in FIG. 1A and FIG. 1C as output 113D of sampler 113. Inputs (e.g., input nodes) IN_A, IN_B and IN_C of thermometer-to-binary encoder 150 can include respective inputs (e.g., input nodes) A, A_BAR, B, B_BAR, C, and C_BAR coupled to outputs 111Dp, 111Dn, 112Dp, 112Dn, 113Dp, and 113Dn, respectively.

FIG. 2 shows a group of information 1A and a group of information 1C that can include information from outputs of respective samplers 111, 112, and 113 at different times. Group of information 1A can correspond to information from outputs of respective samplers 111, 112, and 113 of FIG. 1A. Group of information 1C can correspond to information from outputs of respective samplers 111, 112, and 113 of FIG. 1C. Thermometer-to-binary encoder 150 of FIG. 2 can receive either group of information 1A or group of information 1C at a particular time.

In FIG. 2, information (e.g., signals) Dp_low and Dn_low can be the differential form of information D_low in FIG. 1A or FIG. 1C. Information (e.g., signals) Dp_mid and Dn_mid in FIG. 2 can be the differential form of information D_mid in FIG. 1A or FIG. 1C. Information (e.g., signals) Dp_high and Dn_high in FIG. 2 can be the differential form of information D_high in FIG. 1A or FIG. 1C.

As shown in FIG. 2, the information at inputs IN_A and IN_B in FIG. 2 can be swapped from time to time (e.g., from one operation to another operation). For example (e.g., in an operation), inputs IN_A can receive information Dp_low and Dn_low from group of information 1A while input IN_B receives information Dp_high and Dn_high from group of information 1A. In another example, (e.g., in another operation) inputs IN_A can receive information Dp_high and Dn_high from group of information 1C while input IN_B receives information Dp_low and Dn_low from group of information 1C.

As shown in FIG. 2, transistors P1 through P7 and N1 through N7 include gates coupled to (e.g., or can be part of) respective inputs A, A_BAR, B, B_BAR, C, and C_BAR (of respective inputs IN_A, IN_B, and IN_C) of thermometer-to-binary encoder 150. As described above, the information at inputs IN_A and IN_B can be swapped. Thus, information received at (provided to) the gates of transistors coupled to inputs A and B can be swapped, and information received at (provided to) the gates of transistors coupled to inputs A_BAR and B_BAR can be swapped. However, transistors P1 through P7 and N1 through N7 can form symmetrical logic circuits (e.g., "AND", "OR", and "XOR" and their inversions) with respect to information at the inputs of thermometer-to-binary encoder 150 to provide correct information LSB_BINARY and MSB_BINARY at output (e.g., output nodes) 150L and 150M, respectively, even if input information at inputs IN_A and IN_B are swapped.

As shown in FIG. 2, transistors P1 through P7 and N1 through N7 can form logic circuits. For example, transistors P1 and P2 can form part of an AND logic circuit. Transistors N1 and N2 can form part of another AND logic circuit. Transistors P3, P4, P5, and P6 can form part of an XOR (exclusive or) logic circuit. Transistors N3, N4, N5, and N6 can form part of another XOR (exclusive or) logic circuit. Transistors P7 and N7 can form part of an OR logic circuit.

In FIG. 2, input IN_A (coupled to output 111Dp and 111Dn) and input IN_B (coupled to output 113Dp and 113Dn) can be part of inputs (e.g., input nodes at the gates of transistors P1 and P2) of the AND logic circuit formed in part by transistors P1 and P2. Inputs IN_A and IN_B can be part of inputs (e.g., input nodes at the gates of transistors N1 and N2) of the AND logic circuit formed in part by transistors N1 and N2.

Inputs IN_A and IN_B can be part of inputs (e.g., input nodes at the gates of transistors P3, P4, P5, and P6) of the XOR logic circuit formed in part by transistors P3, P4, P5, and P6. Inputs IN_A and IN_B can be part of inputs (e.g., input nodes at the gates of transistors N3, N4, N5, and N6) of the XOR logic circuit formed in part by transistors N3, N4, N5, and N6.

An output of the AND logic circuit formed in part by transistors P1 and P2 can be part of an output (e.g., output 150L) of thermometer-to-binary encoder 150. An output of the AND logic circuit formed in part by transistors N1 and N2 can be part of an output (e.g., output 150L) of thermometer-to-binary encoder 150.

Thermometer-to-binary encoder 150 can use transistors P1 through P7 and N1 through N7 and inverter INV to perform symmetrical logic functions (e.g., "AND", "OR", and "XOR" and their inversion) to convert (e.g., translate) thermometer-coded information (represented by input information D_low, D_mid, and D_high) into thermometer-coded information (represented by information LSB_BINARY and MSB_BINARY).

The structure (e.g., self-organized structure) of thermometer-to-binary encoder 150 as shown in FIG. 2 allows it to accommodate input swapping (as described above) and provide (e.g., generate) correct output information. This structure (FIG. 2) also allows thermometer-to-binary encoder 150 to support blind input swapping to perform conversion of thermometer-coded information with ad hoc input swapping.

Figure 3A:
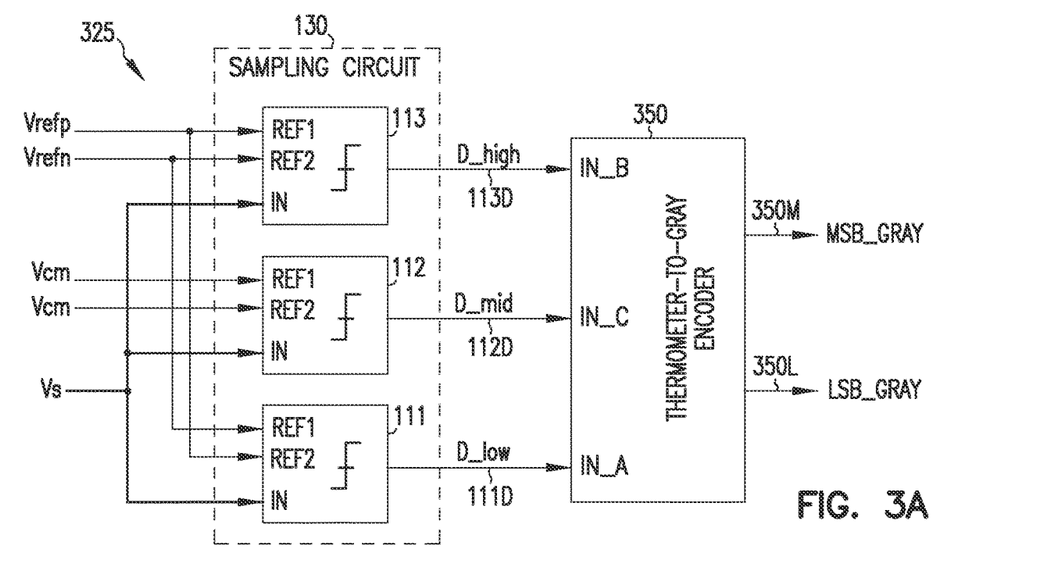
FIG. 3A shows a block diagram of an apparatus in the form of receiving circuitry including a sampling circuit and a thermometer-to-gray encoder, according to some embodiments described herein.
Figure 3B:
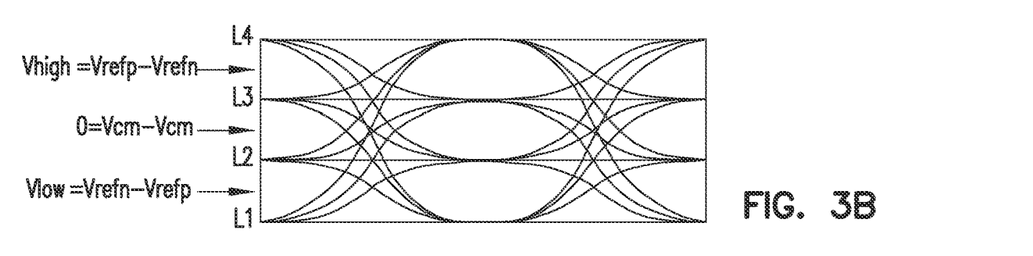
FIG. 3B shows an eye diagram of an input signal at an input of the sampler circuit of FIG. 3A and the relationships among levels of a PAM4 signaling of the input signal and different reference thresholds, according to some embodiments described herein.

FIG. 3A shows a block diagram of receiving circuitry 325 including sampling circuit 130 and a thermometer-to-gray encoder 350, according to some embodiments described herein. Like receiving circuitry 125 of FIG. 1A, receiving circuitry 325 can be included in a receiver of an IC device. However, unlike receiving circuitry 125 of FIG. 1A that includes thermometer-to-binary encoder 150, receiving circuitry 325 in FIG. 3A includes thermometer-to-gray encoder 350. Receiving circuitry 125 and 325 can include similar elements. For simplicity, descriptions and operations of such similar elements are not repeated. For example, as shown in FIG. 3A, receiving circuitry 325 can include sampling circuit 130 having samplers 111, 112, and 113 to sample signal Vs and provide thermometer-coded information D_low, D_mid, and D_high. FIG. 3B shows signal Vs and associated levels L1, L2, L3, and L4 and threshold references Vlow, 0, and Vhigh that are similar to those of FIG. 1B.

Thermometer-to-gray encoder 350 (FIG. 3A) can operate to convert information D_low, D_mid, and D_high (thermometer-coded information) from outputs 111D, 112D, and 113D of samplers 111, 112, and 113, respectively, into Gray-coded information. For example, thermometer-to-gray encoder 350 can generate information (e.g., encoder output information) LSB_GRAY and MSB_GRAY based on information D_low, D_mid, and D_high. Information LSB_GRAY and MSB_GRAY form Gray-coded information (e.g., a 2-bit Gray code). Information LSB_GRAY and MSB_GRAY can represent the least-significant-bit (MSB) and the most-significant-bit (MSB), respectively, of the Gray-coded information. As described above, receiving circuitry 325 can be included in a receiver. Information LSB_GRAY and MSB_GRAY can be provided to additional circuitry (e.g., a deserializer, not shown) of the receiver for further processing.

Figure 3C:
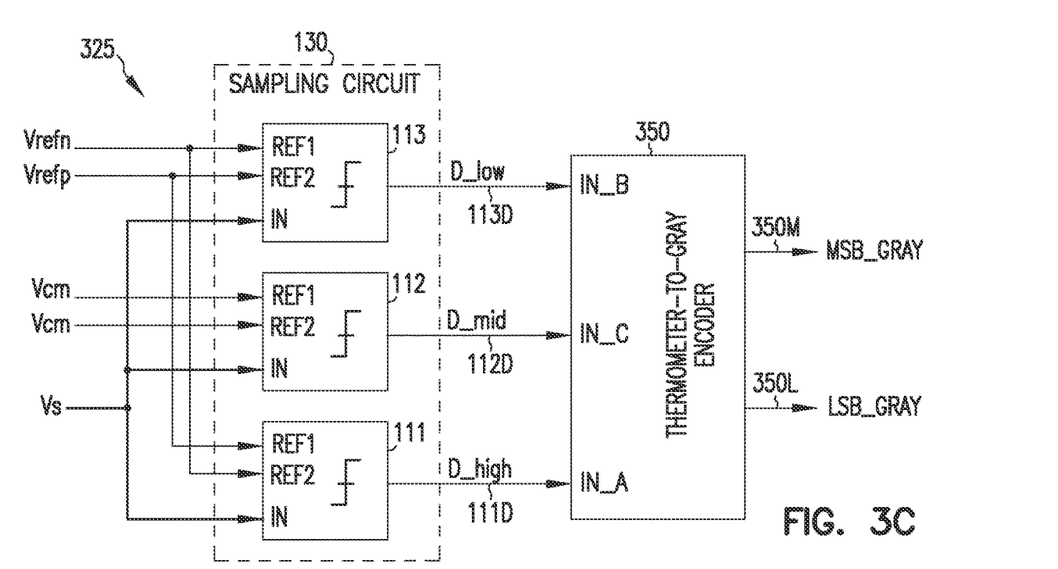
FIG. 3C shows the receiving circuitry of FIG. 3A including input swapping at inputs of the thermometer-to-binary encoder of FIG. 3A, according to some embodiments described herein.

FIG. 3C shows receiving circuitry 325 including input swapping at inputs of thermometer-to-gray encoder 350, according to some embodiments described herein. The input swapping at thermometer-to-gray encoder 350 is similar to that of input swapping at thermometer-to-binary encoder 150 of FIG. 1C. For example, as shown in FIG. 3C, the information (input information) at inputs IN_A and IN_B of thermometer-to-gray encoder 350 are D_high and D_low, respectively. Thus, in comparison with information D_low and D_high at inputs IN_A and IN_B, respectively, of thermometer-to-gray encoder 350 in FIG. 3A, information at inputs IN_A and IN_B in FIG. 3C are swapped.

In FIG. 3C, the functions of samplers 111 and 113 are swapped, such that samplers 111 and 113 operate at different reference thresholds in comparison with reference thresholds of samplers 111 and 113 in FIG. 3A. As shown in FIG. 3C, unlike FIG. 3A, samplers 111 and 113 can provide information D_high and D_low, respectively. The function of sampler 112 in FIG. 3C can remain the same, such that it can operate to provide information V_mid based on the same reference threshold (e.g., Vcm−Vcm=0) like the reference threshold of samplers 112 FIG. 3A. As shown in FIG. 3C, reference information Vrefp and Vrefn provided to respective inputs REF1 and REF2 of samplers 111 and 113 are switched in ways similar to that of samplers 111 and 113 in FIG. 1A and FIG. 1C.

Although information (e.g., input information D_low and D_high) at inputs IN_A and IN_B of thermometer-to-gray encoder 350 are swapped between FIG. 3A and FIG. 3C, thermometer-to-gray encoder 350 can be self-organized to operate to provide output information (e.g., Gray-coded information) at outputs 350L and 350M that correctly reflect the value of signal Vs sampled by sampling circuit 130. Further, thermometer-to-gray encoder 350 can operate to support blind input swapping (e.g., swapping between information D_low and D_high) in that it can provide correct output information without prior knowledge that input information at inputs IN_A and IN_B are swapped. Like samplers 111 and 113, reference information Vrefp and Vrefn provided to respective inputs REF1 and REF2 of samplers 111 and 113 can be switched at different times, such that input swapping at inputs IN_A and IN_B of thermometer-to-gray encoder 350 can happen at different times.

The self-organized and support for blind input swapping allows thermometer-to-gray encoder 350 to be included in devices or systems where functions of some components (e.g., samplers like samplers 111 and 113) are swapped. In some devices or systems that include samplers (e.g., PAM4 samplers) like samplers 111, 112, and 113 in FIG. 3A and FIG. 3C, swapping functions of the samplers from time to time may alleviate asymmetrical aging from the imbalance in sampler operations (e.g., imbalance of "0" and "1" logic detection).

Figure 3D:
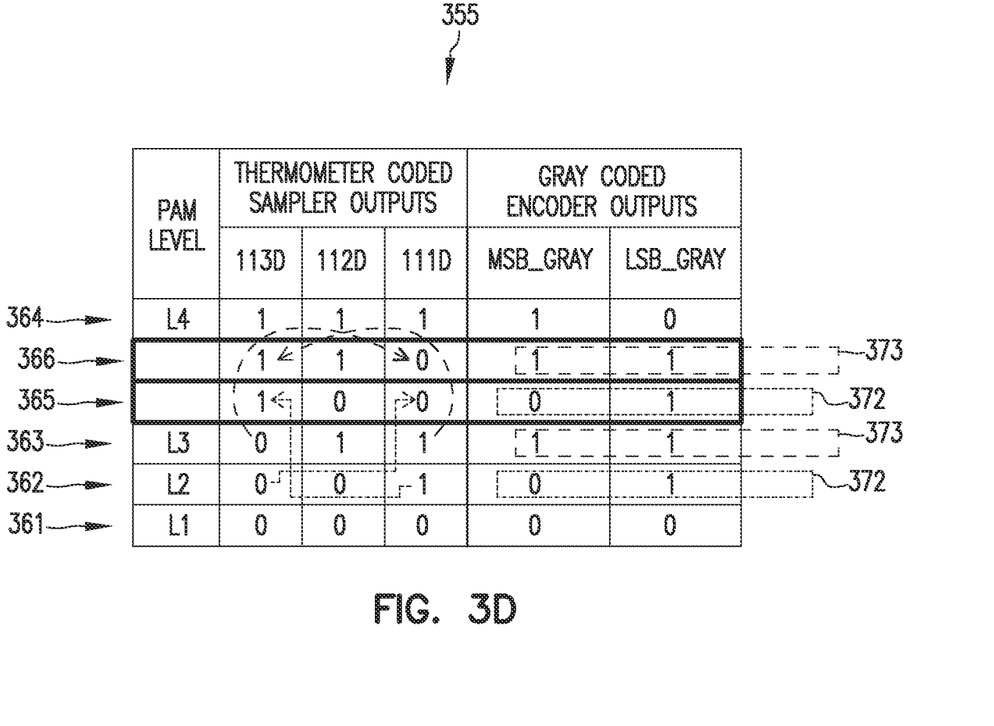
FIG. 3D is a table (logic table) showing relationships among the levels of the input signal of FIG. 3A, thermometer-coded information at outputs of the sampling circuit (FIG. 3A and FIG. 3C), and Gray-coded information at outputs of the thermometer-to-binary encoder of FIG. 3A and FIG. 3C, according to some embodiments described herein.

FIG. 3D is a table (logic table) 355 showing relationships among levels L1, L2, L3, and L4 of signal Vs (FIG. 3A and FIG. 3C); values (represented by information D_low, D_mid, and D_high in FIG. 3A and FIG. 3C) at respective outputs 111D, 112D, and 113D of samplers 111, 112, and 113 (FIG. 3A and FIG. 3C); and values of information LSB_GRAY and MSB_GRAY at respective outputs of thermometer-to-gray encoder 350 (FIG. 3A and FIG. 3C), according to some embodiments described herein. Circuit implementation of thermometer-to-gray encoder 350 can be based on table 355, as described below with reference to FIG. 4.

As shown in FIG. 3D, levels L1, L2, L3, and L4 (e.g., corresponding to symbols −3, −1, +1, and +3, respectively) in rows 361, 362, 363, and 364, respectively, can be associated with respective 3-bit thermometer-coded at sampler outputs 111D, 112D, and 113D (FIG. 1A) that are represented by information D_low, D_mid, and D_high, respectively, in FIG. 3A. Levels L1, L2, L3, and L4 can also be associated with respective 2-bit Gray coded encoder outputs (output information) represented by information MSB_GRAY and LSB_GRAY (e.g., "00", "01", "11" and "10").

As shown in FIG. 3D, table 355 also includes rows 365 and 366 (in addition to rows 361, 362, 363, and 364) to represent input swapping operations (e.g., swapping of D_low and D_high) described above with reference to FIG. 3A and FIG. 3C. For example, as shown in FIG. 3D, outputs 111D and 113D have values "1" and "0", respectively, in row 362, and values "0" and "1", respectively, in row 365. This indicates that the information of outputs 111D and 113D (in rows 362 and 365) are swapped. However, Gray coded encoder outputs in rows 362 and 365 have the same value 372 (e.g., "01").

Thus, even if the values of information at outputs 111D and 113D (in rows 362 and 365) are swapped, Gray coded encoder outputs (in rows 362 and 365) provided by thermometer-to-binary encoder 150 can remain at the same value (value 372).

In another example, information of outputs 111D and 113D (in row 366) have values "0" and "1", respectively, which have information swapped with respect to that ("1" and "0") of row 363. However, Gray coded encoder outputs in rows 363 and 366 have the same value 373 (e.g., "11"). Thus, even if the values of information D_low and D_high (in rows 362 and 366) are swapped, binary coded encoder outputs (in rows 362 and 366) remain at the same value (value 373).

Thus, even if the values of information at outputs 111D and 113D (in rows 363 and 66) are swapped, Gray coded encoder outputs (in rows 363 and 366) provided by thermometer-to-gray encoder 350 can remain at the same value (value 373). Based on table 355, information LSB_GRAY can be implemented as D_high XOR D_low (e.g., LSB_GRAY=D_high XOR D_low). Information MSB_GRAY can be implemented as a buffered version of information D_mid.

Figure 4:
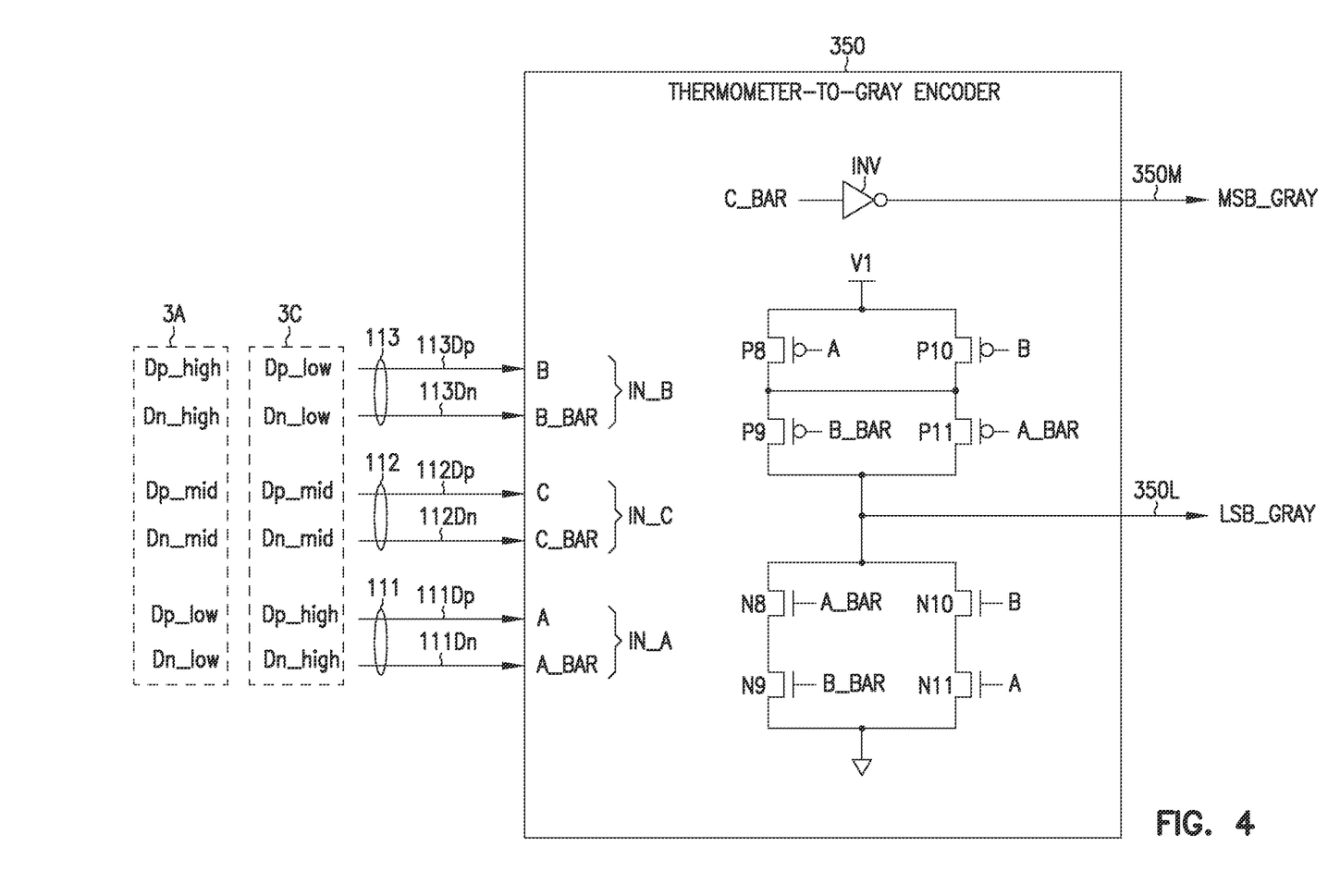
FIG. 4 shows an example circuit implementation of the thermometer-to-gray encoder of FIG. 3A and FIG. 3C based on the table of FIG. 3D, according to some embodiments described herein.

FIG. 4 shows circuit implementation of thermometer-to-gray encoder 350 (FIG. 3A and FIG. 3C) based on table 355 of FIG. 3D, according to some embodiments described herein. As shown in FIG. 4, thermometer-to-gray encoder 350 can include transistors (e.g., PMOS transistors) P8 through P11 and transistors (e.g., NMOS transistors) N8 through N11, and an inverter INV. Voltage V1 in FIG. 4 can include a supply voltage (e.g., Vcc) for thermometer-to-gray encoder 350. FIG. 4 shows differential forms of information D_low, D_mid, and D_high of FIG. 3A, FIG. 3C, and FIG. 3D.

In FIG. 4, outputs (e.g., output nodes) 111Dn and 111Dp are collectively shown in FIG. 3A and FIG. 3C as output 111D of sampler 111. In FIG. 4, outputs (e.g., output nodes) 112Dn and 112Dp are collectively shown in FIG. 3A and FIG. 3C as output 112D of sampler 112. In FIG. 4, outputs (e.g., output nodes) 113Dn and 113Dp are collectively shown in FIG. 3A and FIG. 3C as output 113D of sampler 113. Inputs (e.g., input nodes) IN_A, IN_B and IN_C of thermometer-to-gray encoder 350 can include respective inputs (e.g., input nodes) A, A_BAR, B, B_BAR, C, and C_BAR coupled to outputs 111Dp, 111Dn, 112Dp, 112Dn, 113Dp, and 113Dn, respectively.

FIG. 4 shows a group of information 3A and a group of information 3C that can include information from outputs of respective samplers 111, 112, and 113 at different times. Group of information 3A can correspond to information from outputs of respective samplers 111, 112, and 113 of FIG. 3A. Group of information 3C can correspond to information from outputs of respective samplers 111, 112, and 113 of FIG. 3C. Thermometer-to-gray encoder 350 of FIG. 4 can receive either group of information 3A or group of information 3C at a particular time.

In FIG. 4, information (e.g., signals) Dp_low and Dn_low can be the differential form of information D_low in FIG. 3A or FIG. 3C. Information (e.g., signals) Dp_mid and Dn_mid in FIG. 4 can be the differential form of information D_mid in FIG. 3A or FIG. 3C. Information (e.g., signals) Dp_high and Dn_high in FIG. 4 can be the differential form of information D_high in FIG. 3A or FIG. 3C.

As shown in FIG. 4, the information at inputs IN_A and IN_B in FIG. 4 can be swapped from time to time (e.g., from one operation to another operation). For example (e.g., in an operation), inputs IN_A can receive information Dp_low and Dn_low from group of information 3A while input IN_B receives information Dp_high and Dn_high from group of information 3A. In another example, (e.g., in another operation) inputs IN_A can receive information Dp_high and Dn_high from group of information 3C while input IN_B receives information Dp_low and Dn_low from group of information 3C.

As shown in FIG. 4, transistors P1 through P7 and N1 through N7 include gates coupled to (e.g., or can be part of) respective inputs A, A_BAR, B, B_BAR, C, and C_BAR (of respective inputs IN_A, IN_B, and IN_C) of thermometer-to-gray encoder 350. As described above, the information at inputs IN_A and IN_B can be swapped. Thus, information received at (provided to) the gates of transistors coupled to inputs A and B can be swapped, and information received at (provided to) the gates of transistors coupled to inputs A_BAR and B_BAR can be swapped. However, transistors P8 through P11 and N8 through N11 can form symmetrical logic circuits (e.g., "XOR" and their inversions) with respect to information at the inputs of thermometer-to-gray encoder 350 to provide correct information LSB_GRAY and MSB_GRAY at output (e.g., output nodes) 350L and 350M, respectively, even if input information at inputs IN_A and IN_B are swapped.

As shown in FIG. 4, transistors P8 through P11 and N8 through N11 can form symmetrical logic circuits (e.g., "XOR" and their inversions) with respect to information D_high and D_low, to provide information LSB_GRAY and MSB_GRAY at output (e.g., output nodes) 350L and 350M, respectively.

In FIG. 4, input IN_A (coupled to outputs 111Dp and 111Dn) and input IN_B (coupled to outputs 113Dp and 113Dn) can be part of inputs (e.g., input nodes at the gates of transistors P8, P9, P10, and P11) of the XOR logic circuit formed in part by transistors P8, P9, P10, and P11. Inputs IN_A and IN_B can be part of inputs (e.g., input nodes at the gates of transistors N8, N9, N10, and N11) of the XOR logic circuit formed in part by transistors N8, N9, N10, and N11.

Thermometer-to-gray encoder 350 can use transistors P8 through P11 and N8 through N8 and inverter INV to perform symmetrical logic functions (e.g., "XOR" and their inversion) to convert (e.g., translate) thermometer-coded information (represented by input information D_low, D_mid, and D_high) into thermometer-coded information (represented by information LSB_GRAY and MSB_GRAY).

The structure (e.g., self-organized structure) of thermometer-to-gray encoder 350 as shown in FIG. 4 allows it to accommodate input swapping (as described above) and provide (e.g., generate) correct output information. This structure (FIG. 4) also allows thermometer-to-gray encoder 350 to support blind input swapping to perform conversion of thermometer-coded information with ad hoc input swapping.

The input swapping at inputs of thermometer-to-binary encoder 150 (FIG. 1A and FIG. 1C) and at inputs of thermometer-to-gray encoder 350 (FIG. 3A and FIG. 3C) described above use PAM4 signaling as an example. However, the input swapping techniques described herein can be applicable to 8-level PAM (PAM8), 16-level PAM (PAM16), or other multiple levels PAM signaling.

Figure 5:
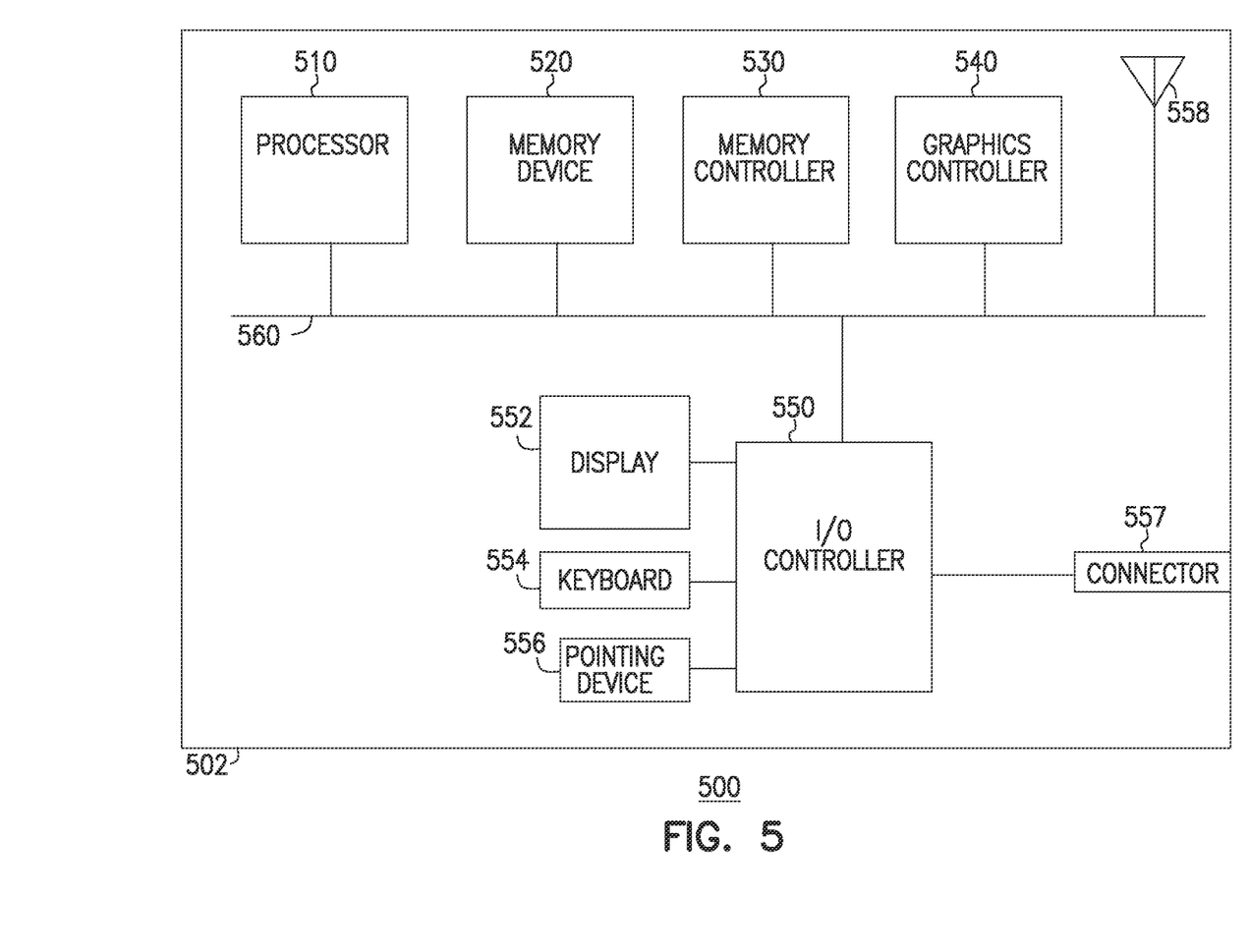
FIG. 5 shows an apparatus in the form of a system (e.g., electronic system), according to some embodiments described herein.

FIG. 5 shows an apparatus in the form of a system (e.g., electronic system) 500, according to some embodiments described herein. System 500 can include or be included in a computer, a tablet, or other electronic system. As shown in FIG. 5, system 500 can include components located on a circuit board (e.g., printed circuit board (PCB)) 502, such as a processor 510, a memory device 520, a memory controller 530, a graphics controller 540, an I/O controller 550, a display 552, a keyboard 554, a pointing device 556, at least one antenna 558, a connector 557, and a bus 560. Bus 560 can include conductive lines (e.g., metal-based traces on a circuit board where the components of system 500 are located).

In some arrangements, system 500 does not have to include a display. Thus, display 552 can be omitted from system 500. In some arrangements, system 500 does not have to include any antenna. Thus, antenna 558 can be omitted from system 500. In some arrangements, system 500 does not have to include a connector. Thus, connector 557 can be omitted from system 500.

Processor 510 can include a general-purpose processor, an application-specific integrated circuit (ASIC), or other kinds of processors. Processor 510 can include a CPU.

Memory device 520 can include a dynamic random-access memory (DRAM) device, a static random-access memory (SRAM) device, a flash memory device, phase change memory, a combination of these memory devices, or other types of memory. FIG. 5 shows an example where memory device 520 is a stand-alone memory device separated from processor 510. In an alternative arrangement, memory device 520 and processor 510 can be located on the same die. In such an alternative arrangement, memory device 520 is an embedded memory in processor 510, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 550 can include a communication module for wired or wireless communication (e.g., communication through one or more antenna 558). Such wireless communication may include communication in accordance with WiFi communication technique, Long Term Evolution Advanced (LTE-A) communication technique, or other communication techniques.

I/O controller 550 can also include a module to allow system 500 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 557 can be arranged (e.g., can include terminals (e.g., pins)) to allow system 500 to be coupled to an external device (or system). This may allow system 500 to communicate (e.g., exchange information) with such a device (or system) through connector 557. Connector 557 and at least a portion of bus 560 can include conductive lines that conform with at least one of USB, DP, HDMI, Thunderbolt, PCIe, Ethernet, and other specifications.

At least one of processor 510, memory device 520, memory controller 530, graphics controller 540, and I/O controller 550 can include a receiver that can include receiving circuitry, such as receiving circuitry 125 (FIG. 1A) or receiving circuitry 325 (FIG. 3A) described above with reference to FIG. 1A through FIG. 4. Such receiving circuitry in one or more of processor 510, memory device 520, memory controller 530, graphics controller 540, and I/O controller 550 of system 500 can operate to receive PAM signals (e.g., PAM4 signals) from components inside system 500 or from an external source (e.g., through connector 557) outside system 500. Such receiving circuitry in one or more of processor 510, memory device 520, memory controller 530, graphics controller 540, and I/O controller 550 of system 500 can include thermometer-to-binary encoder 150 (described above with reference to FIG. 1A through FIG. 2) or thermometer-to-gray encoder 350 or (described above with reference to FIG. 3A through FIG. 4).

FIG. 5 shows the components of system 500 arranged separately from each other as an example. For example, processor 510, memory device 520, memory controller 530, graphics controller 540, and I/O controller 550 can be located on a separate IC (e.g., semiconductor die or an IC chip). In some arrangements, two or more components (e.g., processor 510, memory device 520, graphics controller 540, and I/O controller 550) of system 500 can be located on the same die (e.g., same IC chip) that can be part of a system on chip (SoC), a system in a package (SiP), or other electronic devices or systems.

The illustrations of the apparatuses (e.g., receiving circuitry 125 or 325, and any of the encoders (e.g., thermometer-to-binary encoder 150 or thermometer-to-gray encoder 350) described above with reference to FIG. 1A through FIG. 4) and methods (e.g., operations of receiving circuitry 125 or 325, and any of the encoders (e.g., thermometer-to-binary encoder 150 or thermometer-to-gray encoder 350) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including a first input of an encoder to receive first information during a first time interval and second information during a second time interval, a second input of the encoder to receive third information during the first time interval and fourth input information during the second time interval, the first and third information included in a first thermometer-coded information, and the second and fourth information included in a second thermometer-coded information, the first and fourth information having a first value, and the second and third information having a second value, and an output of the encoder to provide first output information during the first time interval and second output information during the second time interval, wherein the first and second output information have a same value.

In Example 2, the subject matter of Example 1 may optionally include, wherein each of the first and second output information includes binary-coded information.

In Example 3, the subject matter of Example 1 may optionally include, wherein each of the first and second output information includes Gray-coded information.

In Example 4, the subject matter of Example 1 may optionally include, wherein each of the first and second output information includes bits, the bits including a most-significant bit and a least-significant bit.

In Example 5, the subject matter of Example 1 may optionally include, wherein the first and second inputs are part of inputs of an AND logic circuit of the encoder, and the first and second inputs are part of inputs of an exclusive-OR logic circuit of the encoder.

In Example 6, the subject matter of Example 5 may optionally include, wherein the first and second inputs are part of inputs of an additional AND logic circuit of the encoder, and the first and second inputs are part of inputs of an additional exclusive-OR logic circuit of the encoder.

In Example 7, the subject matter of Example 1 may optionally include, wherein each of the first thermometer-coded information and the second thermometer-coded information is generated from sampling a pulse-amplitude modulation (PAM) signal.

Example 8 includes subject matter (such as a device, an electronic apparatus (e.g., circuit, electronic system, or both), or a machine) including a first AND logic circuit, a first exclusive-OR logic circuit coupled to the first AND logic circuit, a second AND logic circuit coupled to the first AND logic circuit, a second exclusive-OR circuit coupled to the first exclusive-OR logic circuits, an OR logic circuit coupled to the first and second exclusive-OR logic circuits and the first and second AND logic circuits, wherein inputs of the first and second AND logic circuits are part of inputs of a thermometer-to-binary encoder that includes the inputs of the first and second AND logic circuits, the first and second exclusive-OR logic circuits, and the OR logic circuit, wherein the inputs of the first and second exclusive-OR logic circuits are part of inputs of the thermometer-to-binary encoder, and wherein an output of one of the first and second AND logic circuits is part of an output of the thermometer-to-binary encoder.

In Example 9, the subject matter of Example 8 may optionally include, wherein the first AND logic circuit includes transistors of a first transistor-type, and the second AND logic circuit includes transistors of a second transistor-type.

In Example 9, the subject matter of Example 8 may optionally include, wherein the first AND logic circuit includes transistors of a first transistor-type, and the second AND logic circuit includes transistors of a second transistor-type.

In Example 10, the subject matter of Example 8 may optionally include, wherein the first exclusive OR logic circuit includes transistors of a first transistor-type, and the second exclusive-OR logic circuits includes transistors of a second transistor-type.

In Example 11, the subject matter of Example 8 may optionally include, wherein the OR logic circuit includes a first transistor of a first transistor-type, and the second transistor of a second transistor-type.

Example 12 includes subject matter (such as a device, an electronic apparatus (e.g., circuit, electronic system, or both), or a machine) including a sampling circuit including at least a first sampler and a second sampler, the first and second samplers to sample an input signal during a first time interval based on a first reference threshold and a second reference threshold, respectively, the sampling circuit to provide a first thermometer-coded information based on sampling of the input signal during the first time interval, the first and second samplers to sample the input signal during a second time interval based on the second reference threshold and the first reference threshold, respectively, the sampling circuit to provide a second thermometer-coded information based on sampling of the input signal during the second time interval, and an encoder coupled to the sampling circuit to provide first output information based on the first thermometer-coded information, and second output information based on the second thermometer-coded information, wherein the first and second output information have a same value.

In Example 13, the subject matter of Example 12 may optionally include, wherein the sampling circuit includes a third sampler to sample the input signal during the first and second time intervals based on a third reference threshold.

In Example 14, the subject matter of Example 12 may optionally include, wherein the encoder is a thermometer-to-binary encoder.

In Example 15, the subject matter of Example 12 may optionally include, wherein the encoder is a thermometer-to-gray encoder.

Example 16 includes subject matter (such as a device, an electronic apparatus (e.g., circuit, electronic system, or both), or a machine) including a first node to provide first reference information, a second node to provide second reference information, a first sampler to sample an input signal during a first time interval and a second time interval, the first sampler including a first input and a second input, the first input to couple to the first node during the first time interval and to couple to the second node during the second time interval, and the second input to couple to the second node during the first time interval and to couple to the first node during the second time interval, a second sampler to sample the input signal during the first time interval and the second time interval, the second sampler including a third input and a fourth input, the third input to couple to the second node during the first time interval and to couple to the first node during the second time interval, and the fourth input to couple to the first node during the first time interval and to couple to the second node during the second time interval, and an encoder coupled to the first and second samplers to provide encoder output information based on sampler output information from each of the first and second samplers.

In Example 17, the subject matter of Example 16 may optionally include, further comprising a third sampler to sample the input signal during the first time interval and the second time interval, the third sampler including a fifth input to couple to the first node during the first and second time intervals, and a sixth input to couple to the second node during the first and second time intervals.

In Example 18, the subject matter of Example 16 may optionally include, wherein the first and second reference information are part of a differential pair.

In Example 19, the subject matter of Example 16 may optionally include, wherein the encoder output information includes binary-coded information.

In Example 20, the subject matter of Example 16 may optionally include, wherein the encoder output information includes Gray-coded information.

Example 21 includes subject matter (such as a device, an electronic apparatus (e.g., circuit, electronic system, or both), or a machine) including conductive lines on a circuit board, a first device coupled to the conductive lines, and a second device coupled the conductive lines, at least one of the first and second devices including a receiving circuit, the receiving circuit including an encoder including a first input to receive first information during a first time interval and second information during a second time interval, and a second input to receive third information during the first time interval and fourth information during the second time interval, wherein the first and third information are part of a first thermometer-coded information, and the second and fourth information are part of a second thermometer-coded information, and wherein the first and fourth information have a first value, and the second and third information have a second value, and the encoder to provide first output information during the first time interval and second output information during the second time interval, wherein the first and second output information have a same value.

In Example 22, the subject matter of Example 16 may optionally include, wherein the encoder is a thermometer-to-binary encoder.

In Example 23, the subject matter of Example 16 may optionally include, wherein the encoder is a thermometer-to-gray encoder.

In Example 24, the subject matter of Example 16 may optionally include, wherein each of the first and second thermometer-coded information is generated based on sampling of 4-level pulse-amplitude modulation (PAM4) signal.

In Example 25, the subject matter of Example 16 may optionally include, further comprising a connector coupled to the conductive lines, the connector conforming with one of Universal Serial Bus (USB), High-Definition Multimedia Interface (HDMI), Thunderbolt, Peripheral Component Interconnect Express (PCIe), and Ethernet specifications.

The subject matter of Example 1 through Example 25 may be combined in any combination.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first input of an encoder to receive first information during a first time interval and second information during a second time interval;
a second input of the encoder to receive third information during the first time interval and fourth input information during the second time interval;
the first and third information included in a first thermometer-coded information, and the second and fourth information included in a second thermometer-coded information;
the first and fourth information having a first value, and the second and third information having a second value; and
an output of the encoder to provide first output information during the first time interval and second output information during the second time interval, wherein the first and second output information have a same value.

2. The apparatus of claim 1, wherein each of the first and second output information includes binary-coded information.

3. The apparatus of claim 1, wherein each of the first and second output information includes Gray-coded information.

4. The apparatus of claim 1, wherein each of the first and second output information includes bits, the bits including a most-significant bit and a least-significant bit.

5. The apparatus of claim 1, wherein the first and second inputs are part of inputs of an AND logic circuit of the encoder, and the first and second inputs are part of inputs of an exclusive-OR logic circuit of the encoder.

6. The apparatus of claim 5, wherein the first and second inputs are part of inputs of an additional AND logic circuit of the encoder, and the first and second inputs are part of inputs of an additional exclusive-OR logic circuit of the encoder.

7. The apparatus of claim 1, wherein each of the first thermometer-coded information and the second thermometer-coded information is generated from sampling a pulse-amplitude modulation (PAM) signal.

8. An apparatus comprising:
a first AND logic circuit;
a first exclusive-OR logic circuit coupled to the first AND logic circuit;
a second AND logic circuit coupled to the first AND logic circuit;
a second exclusive-OR circuit coupled to the first exclusive-OR logic circuits;
an OR logic circuit coupled to the first and second exclusive-OR logic circuits and the first and second AND logic circuits;
wherein inputs of the first and second AND logic circuits are part of inputs of a thermometer-to-binary encoder that includes the inputs of the first and second AND logic circuits, the first and second exclusive-OR logic circuits, and the OR logic circuit;
wherein the inputs of the first and second exclusive-OR logic circuits are part of inputs of the thermometer-to-binary encoder; and
wherein an output of one of the first and second AND logic circuits is part of an output of the thermometer-to-binary encoder.

9. The apparatus of claim 8, wherein the first AND logic circuit includes transistors of a first transistor-type, and the second AND logic circuit includes transistors of a second transistor-type.

10. The apparatus of claim 8, wherein the first exclusive OR logic circuit includes transistors of a first transistor-type, and the second exclusive-OR logic circuits includes transistors of a second transistor-type.

11. The apparatus of claim 8, wherein the OR logic circuit includes a first transistor of a first transistor-type, and the second transistor of a second transistor-type.

12. An apparatus comprising:
a sampling circuit including at least a first sampler and a second sampler;
the first and second samplers to sample an input signal during a first time interval based on a first reference threshold and a second reference threshold, respectively, the sampling circuit to provide a first thermometer-coded information based on sampling of the input signal during the first time interval;
the first and second samplers to sample the input signal during a second time interval based on the second reference threshold and the first reference threshold, respectively, the sampling circuit to provide a second thermometer-coded information based on sampling of the input signal during the second time interval; and
an encoder coupled to the sampling circuit to provide first output information based on the first thermometer-coded information, and second output information based on the second thermometer-coded information, wherein the first and second output information have a same value.

13. The apparatus of claim 12, wherein the sampling circuit includes a third sampler to sample the input signal during the first and second time intervals based on a third reference threshold.

14. The apparatus of claim 12, wherein the encoder is a thermometer-to-binary encoder.

15. The apparatus of claim 12, wherein the encoder is a thermometer-to-gray encoder.

16. An apparatus comprising:
a first node to provide first reference information;
a second node to provide second reference information;
a first sampler to sample an input signal during a first time interval and a second time interval, the first sampler including a first input and a second input,
the first input to couple to the first node during the first time interval and to couple to the second node during the second time interval, and
the second input to couple to the second node during the first time interval and to couple to the first node during the second time interval;
a second sampler to sample the input signal during the first time interval and the second time interval, the second sampler including a third input and a fourth input,
the third input to couple to the second node during the first time interval and to couple to the first node during the second time interval, and
the fourth input to couple to the first node during the first time interval and to couple to the second node during the second time interval; and
an encoder coupled to the first and second samplers to provide encoder output information based on sampler output information from each of the first and second samplers.

17. The apparatus of claim 16, further comprising:
a third sampler to sample the input signal during the first time interval and the second time interval, the third sampler including:
a fifth input to couple to the first node during the first and second time intervals; and
a sixth input to couple to the second node during the first and second time intervals.

18. The apparatus of claim 16, wherein the first and second reference information are part of a differential pair.

19. The apparatus of claim 16, wherein the encoder output information includes binary-coded information.

20. The apparatus of claim 16, wherein the encoder output information includes Gray-coded information.

21. An apparatus comprising:
conductive lines on a circuit board;
a first device coupled to the conductive lines; and
a second device coupled the conductive lines, at least one of the first and second devices including a receiving circuit, the receiving circuit including:
an encoder including a first input to receive first information during a first time interval and second information during a second time interval, and a second input to receive third information during the first time interval and fourth information during the second time interval;
wherein the first and third information are part of a first thermometer-coded information, and the second and fourth information are part of a second thermometer-coded information, and wherein the first and fourth information have a first value, and the second and third information have a second value; and
the encoder to provide first output information during the first time interval and second output information during the second time interval, wherein the first and second output information have a same value.

22. The apparatus of claim 21, wherein the encoder is a thermometer-to-binary encoder.

23. The apparatus of claim 21, wherein the encoder is a thermometer-to-gray encoder.

24. The apparatus of claim 21, wherein each of the first and second thermometer-coded information is generated based on sampling of 4-level pulse-amplitude modulation (PAM4) signal.

25. The apparatus of claim 21, further comprising a connector coupled to the conductive lines, the connector conforming with one of Universal Serial Bus (USB), High-Definition Multimedia Interface (HDMI), Thunderbolt, Peripheral Component Interconnect Express (PCIe), and Ethernet specifications.

* * * * *